(12) United States Patent
Male et al.

(10) Patent No.: US 9,761,543 B1
(45) Date of Patent: Sep. 12, 2017

(54) INTEGRATED CIRCUITS WITH THERMAL ISOLATION AND TEMPERATURE REGULATION

(71) Applicant: Texas Instruments Incorporated, Dallas, TX (US)

(72) Inventors: Barry Jon Male, West Granby, CT (US); Benjamin Cook, Addison, TX (US); Robert Alan Neidorff, Bedford, NH (US); Steve Kummerl, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/385,098

(22) Filed: Dec. 20, 2016

(51) Int. Cl.
| | |
|---|---|
| *H01L 23/00* | (2006.01) |
| *H01L 23/38* | (2006.01) |
| *H01L 23/495* | (2006.01) |
| *H01L 23/31* | (2006.01) |
| *H01L 23/34* | (2006.01) |
| *H01L 23/498* | (2006.01) |
| *H01L 27/02* | (2006.01) |

(52) U.S. Cl.
CPC .......... *H01L 23/562* (2013.01); *H01L 23/315* (2013.01); *H01L 23/3107* (2013.01); *H01L 23/345* (2013.01); *H01L 23/38* (2013.01); *H01L 23/4952* (2013.01); *H01L 23/49513* (2013.01); *H01L 23/49541* (2013.01); *H01L 23/49568* (2013.01); *H01L 23/49861* (2013.01); *H01L 27/0248* (2013.01); *H01L 2924/14* (2013.01); *H01L 2924/181* (2013.01)

(58) Field of Classification Search
CPC ........... H01L 2924/181; H01L 2924/14; H01L 27/0248; H01L 23/3107; H01L 23/49861
See application file for complete search history.

(56) References Cited

U.S. PATENT DOCUMENTS

| | | | |
|---|---|---|---|
| 4,007,978 | A | 2/1977 | Holton |
| 4,267,484 | A | 5/1981 | O'Loughlin |
| 4,272,753 | A | 6/1981 | Nicolay |
| 5,389,578 | A | 2/1995 | Hodson et al. |
| 5,929,514 | A | 7/1999 | Yalamanchili |
| 6,507,264 | B1 | 1/2003 | Whitney |

(Continued)

FOREIGN PATENT DOCUMENTS

EP        1986297 A2    10/2008

OTHER PUBLICATIONS

Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).

(Continued)

*Primary Examiner* — Ngan Ngo
(74) *Attorney, Agent, or Firm* — John R. Pessetto; Charles A. Brill; Frank D. Cimino

(57) ABSTRACT

Integrated circuits with a molded package including a cavity and a semiconductor die spaced from an interior surface of the molded package within the cavity. The semiconductor die includes one or more electrical components, a thermal control component to control the temperature of the electrical component, and a driver to provide a current or voltage signal to the thermal control component at least partially according to a setpoint signal.

20 Claims, 7 Drawing Sheets

(56) References Cited

U.S. PATENT DOCUMENTS

| | | |
|---|---|---|
| 6,509,574 B2 | 1/2003 | Yuan et al. |
| 6,977,468 B1 | 12/2005 | Baginski |
| 7,015,587 B1 | 3/2006 | Poddar |
| 7,321,162 B1 | 1/2008 | Lee et al. |
| 7,732,892 B2 | 6/2010 | Jeng et al. |
| 7,842,542 B2 | 11/2010 | Shim et al. |
| 7,869,180 B2 | 1/2011 | Cheung et al. |
| 8,018,705 B2 | 9/2011 | Michalopoulos et al. |
| 8,569,082 B2 | 10/2013 | Kummerl et al. |
| 8,633,551 B1 | 1/2014 | Teh et al. |
| 9,184,012 B2 | 11/2015 | Wang |
| 9,419,075 B1 | 8/2016 | Carothers et al. |
| 2004/0084729 A1 | 5/2004 | Leung et al. |
| 2007/0076421 A1 | 4/2007 | Kogo |
| 2007/0229177 A1* | 10/2007 | Moriya .................... H03B 5/32 331/158 |
| 2008/0266730 A1 | 10/2008 | Viborg et al. |
| 2010/0187652 A1 | 7/2010 | Yang |
| 2013/0134445 A1 | 5/2013 | Tarsa |
| 2013/0194057 A1* | 8/2013 | Ruby ....................... H03H 3/02 333/188 |
| 2013/0320548 A1 | 12/2013 | Carpenter et al. |
| 2013/0329324 A1 | 12/2013 | Tziviskos et al. |
| 2014/0001632 A1 | 1/2014 | Uehling et al. |
| 2014/0264905 A1 | 9/2014 | Lee et al. |
| 2015/0069537 A1 | 3/2015 | Lo et al. |
| 2015/0249043 A1 | 9/2015 | Elian |
| 2015/0369681 A1* | 12/2015 | Imai ........................ G01C 5/06 73/727 |
| 2015/0369682 A1* | 12/2015 | Nakajima ............... G01L 9/065 73/384 |
| 2016/0003436 A1* | 1/2016 | Singer ................. H01L 25/0753 362/543 |
| 2016/0167089 A1 | 6/2016 | Ng |
| 2016/0209285 A1* | 7/2016 | Nakajima ............... G01L 9/065 |
| 2017/0089789 A1* | 3/2017 | Kanemoto ............ G01L 9/0054 |
| 2017/0134004 A1* | 5/2017 | Isozaki .................... H03H 9/19 |

OTHER PUBLICATIONS

National Semiconductor Corporation, "Semiconductor Packaging Assembly Technology," National Semiconductor Corporation, Aug. 1999, pp. 1-8.

Cook, et al.: "Floating Die Package"; U.S. Appl. No. 15/248,151, filed Aug. 26, 2016; 34 pages.

Maloberti, F., "Layout of Analog CMOS Integrated Circuit, Part 2 Transistors and Basic Cells Layout," retrieved from http:ims.unipv.it/Courses/download/AIC/Layout02.pdf, dated Mar. 15, 2004 (38 pages).

Texas Instruments Product Brochure ISO7841x High-Performance, 8000-Vpk Reinforced Quad-Channel Digital Isolator, dated Nov. 2014 (37 pages).

Texas Instruments Application Report "The ISO72x Family of High-Speed Digital Isolators," SLLA198—Jan. 2006 (12 pages).

Texas Instruments Developers Guide "Digital Isolator Design Guide," SLLA284A, Jan. 2009 (19 pages).

Wikipedia article "3D Printing," retrieved from "http://en.wikipedia.org/w/index.php?title=3D_printing&oldid=624190184", dated Sep. 4, 2014 (35 pages).

OSRAM Opto Semiconductors GmbH, Oslon Compact (850nm), version 1.6, SFH 4710, dated Dec. 1, 2015 (13 pages).

* cited by examiner

INTEGRATED CIRCUITS WITH THERMAL ISOLATION AND TEMPERATURE REGULATION

BACKGROUND

Temperature regulated circuits are important for instrumentation, metrology and other devices in which stable voltage or current signals are required. Electrical components formed in or on a semiconductor substrate are typically subject to thermal drift in operation. Heat sinks and other techniques can help remove heat from a molded package of an integrated circuit (IC). Certain approaches use on-board heating or thermal transfer components to control the temperature of electrical components in an IC. These techniques can be coupled with thermal insulation structures to facilitate component temperature stabilization. These approaches, however, are expensive and increase power consumption. Components in an IC are also influenced by mechanical stress resulting in parametric shifting and potential drift over temperature. For example, electrical characteristics such as threshold voltages of transistors, high precision reference voltages of ICs, etc. are known to drift due to thermo-mechanical stresses caused by the packaging materials. Low modulus of elasticity packaging materials can be used to enhance stress immunity, but these materials typically have a high coefficient of thermal expansion (CTE), and IC devices packaged in such material still suffer from parametric variation due to both stress and temperature drift.

SUMMARY

Disclosed examples include integrated circuits with a molded package including a cavity, and a semiconductor die within the cavity. The semiconductor die includes one or more electrical components, with a thermal control component and a driver to control the temperature of the electrical component. The semiconductor die is at least partially spaced from an interior surface of the molded package within the cavity to improve thermal insulation for improved temperature stability. In certain examples, all of the outer surface of the semiconductor die 102 is spaced from the interior surface of the molded package structure 106, and the die is supported by the bondwire attachments to further enhance thermal insulation and mitigate mechanical stress.

DETAILED DESCRIPTION

Figure 1:
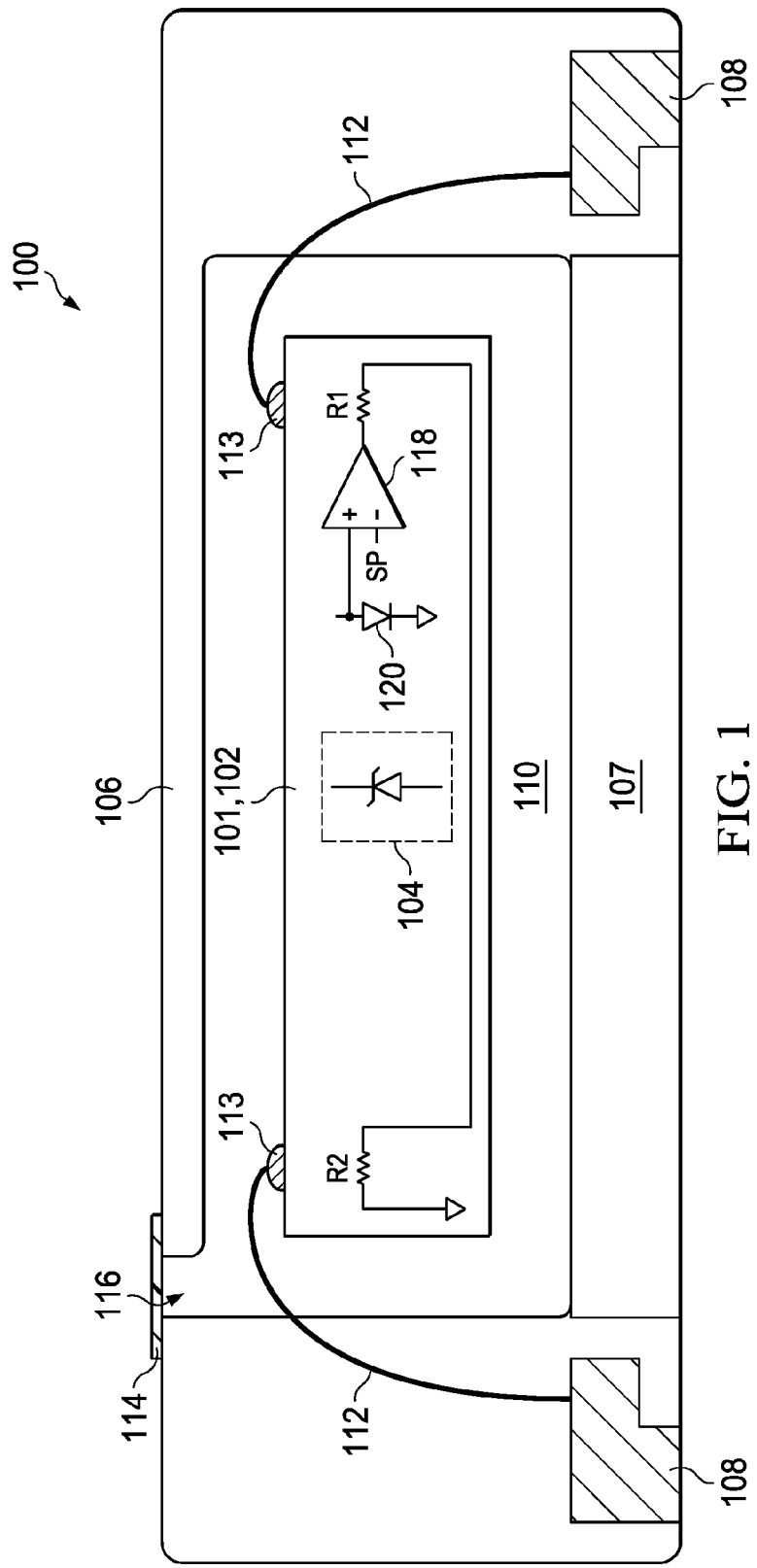
FIG. 1 is a sectional side elevation view of an integrated circuit including a semiconductor die suspended by bond wires in a sealed internal cavity for thermal isolation from a molded package structure, and a resistive thermal control circuit to regulate the temperature of an electrical component according to one embodiment.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows an integrated circuit (IC) 100 with a semiconductor die 102 that includes one or more electrical components 104. In certain example, the die 102 includes a substrate 101, such as silicon, SOI, or other semiconductor substrate, and the component or components 104 is/are formed on or in the substrate 101. The component 104 in one example is a Zener diode used to generate a stable voltage reference signal for use in the IC 100 or in a host circuit (not shown). The component 104 in other examples is a resistor, an inductor, a capacitor, a voltage reference, an oscillator circuit or other frequency time base, or combinations thereof or other single component of higher order circuit functions such as amplifiers, voltage to current converters, A/D converters, etc. By regulating or otherwise controlling the temperature of the component or components 104, compact imprecise components can be used which take up less area while providing thermal stability.

The IC 100 is housed in a molded package structure 106 with a leadframe structure that includes a base 107, such as a die or chip paddle, and a plurality of electrical conductors 108. The example of FIG. 1 is a surface mount IC 100 where the leadframe electrical conductors 108 have exposed planar bottom surfaces to allow soldering of the finished IC to corresponding pads of a host printed circuit board (PCB, not shown) for electrical connection to the die 102. The molded package structure 106 can be any suitable molding material that provides electrical insulation and mechanical protection for the die 102, and can include low modulus of elasticity material to enhance stress immunity. The disclosed thermal and mechanical isolation techniques and concepts allow use of molded package materials 106 that have a high coefficient of thermal expansion (CTE) and high thermal conductivity to save cost, while providing temperature stabilized operation of the electrical component or components 104.

As shown in FIG. 1, the molded package 106 includes a chamber or cavity 110, and the semiconductor die 102 is wholly or at least partially spaced from an interior surface of the molded package 106 within the cavity 110. The die 102 can be supported in any suitable manner within the cavity 110, with at least a portion of the outer surface of the semiconductor die 102 is spaced from the interior surface of the molded package structure cavity 110. In this manner, the outer die surface is not in contact with the thermally conductive molded package material 106 or base 107. Instead, the die 102 is thermally isolated by air or other gas in the molded package cavity 110, which has a generally higher thermal insulation coefficient. This, in turn, facilitates internal control of the temperature of the electrical component 104 during operation as described further below. In various alternate embodiments, the cavity 110 is evacuated of gas or backfilled and sealed via the film 114 with a lower atomic weight gas in order to achieve higher levels of thermal insulation.

In addition to improved thermal stability, certain disclosed examples facilitate mechanical stability by wholly or at least partially isolating the electrical component 104 and the host die 102 from stresses associated with the molded package material 106. In the example of FIG. 1, the entire outer surface of the semiconductor die 102 is spaced from the interior surface of the molded package structure 106. In other examples, part of the surface of the die 102 can be in contact with the interior surface of the molded package structure 106 in the cavity 110, or in contact with support structures, etc. (e.g., FIG. 4 below).

In FIG. 1, the die 102 is suspended by bond wires 112 that extend from the leadframe conductive structures 108 into the internal cavity 110. The bond wires 112 are soldered, ultrasonically welded or otherwise connected to bond pads 113 on the top of the semiconductor die 102 to form electrical connection between the bond pads 113 and the associated leadframe conductive structures 108 prior to a molding process to form the molded package material 106. The cavity 110 is sealed in the example of FIG. 1 by a film layer 114 that covers a cavity port or aperture 116. The port 116 can be in the upper portion of the cavity 110 as illustrated, or the cavity can be ported through the side, or through the bottom, or combinations thereof. The port 116 can be used to facilitate fabrication of the suspended die structure using sublimation materials or other sacrificial materials that are thermally evaporated or sublimated after formation of the molded structure 106 to leave the die 102 suspended by the bond wires 112 as shown in FIG. 1. Suitable fabrication processes and materials are illustrated and described in U.S. patent application Ser. No. 15/248,151, filed Aug. 26, 2016, and entitled "Floating Die Package", the entirety of which is hereby incorporated by reference.

In certain example, the molding structure 106 covers or otherwise seals the semiconductor die 102, parts of the leadframe structure 107, 108 and the bond wires 112. The cavity 110 in one example is formed by depositing a sacrificial encapsulant material over the semiconductor die 102 prior to molding, and heating to cause sublimation of the sacrificial encapsulant material through the port 116 of the molding structure 106. This process leaves a space in which the semiconductor die 102 is floating over the leadframe base 107 due to sublimation or shrinkage/delamination of a die attach material deposited between the die 102 and the base 107. The film layer 114 is then formed over or on the molded structure 106 to cover the port 116 and provide a hermetically sealed IC structure 100. The separation or spacing of the outer surface of the die 102 from the interior surface of the molded material 106 provides air gap thermal insulation on all sides of the die 102, leaving the bond wires 112 as the only significant thermal conduction path to the outside environment. The diameter, length, location and quantity of the bond wires 112 maintain the die in a fixed position in the cavity 110. This approach enables low-power, temperature management of just the silicon die, rapid power-up and settling time, minimal and managed thermocouple effects and almost no parametric electrical shift due to mechanical stress and hysteresis.

As shown in FIG. 1, the die 102 includes a resistive thermal control circuit R1, R2, 118, 120 to regulate or otherwise control the temperature of the electrical component 104 according to one embodiment. Other thermal control circuitry can be used, whether open-loop or closed loop. The disclosed examples facilitate regulation of the operating temperature of the electric component 104 to be largely or completely independent of outside temperature and mechanical stress by integration of temperature control, management of thermal paths throughout the device and isolation of the silicon die 102 from mechanical stress sources. The semiconductor die 102 in FIG. 1 includes one or more thermal control components forming a temperature compensation circuit. The example includes resistors R1 and R2 in thermal conduction with the electrical component 104 to control the temperature of the electrical component 104, and a driver 118 to provide a current or voltage signal or waveform to the thermal control components R1, R2 at least partially according to a setpoint signal SP. In some examples, the driver 118 applies a specific time-varying signal to the thermal control circuit, such as a periodic pulse or sinewave.

A thermal sensor, such as a diode 120 is included in certain embodiments to provide a heater and closed-loop servo control in the floating silicon die 102. The thermal sensing component 120 in one example is biased by a supply current source (not shown) and is physical proximity to the electrical component 104. The sensor 120 senses the temperature of the electrical component 104 and provides a first signal to the non-inverting input of the driver 118. In one example, the sensor 120 provides a voltage signal to an input of a driver amplifier 118. In one example, a fixed setpoint SP signal is provided to an inverting input of the driver amplifier 118 from a voltage source of the die 102. In other examples, the setpoint signal SP is adjustable, and can be trimmed during manufacturing or calibration. In this example, the driver receives a feedback signal from the thermal sensor 120 and provides the current or voltage signal to the thermal control components R1 and R2 in closed-loop fashion to drive the feedback signal to the level of the setpoint signal SP. This regulates the temperature of the electrical component 104 to a temperature corresponding to the setpoint signal SP.

Figure 2:
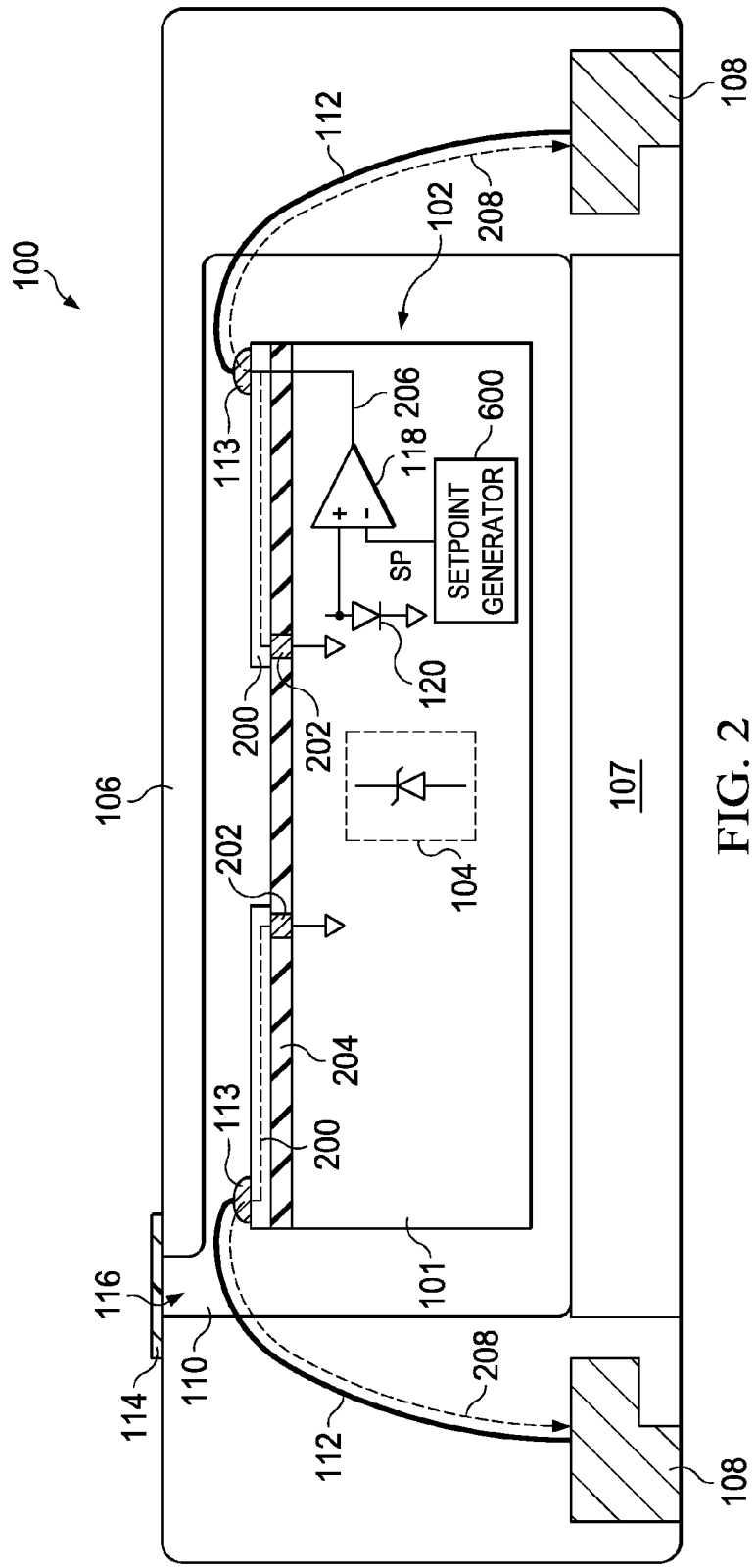
FIG. 2 is a sectional side elevation view of another integrated circuit embodiment including a semiconductor die suspended in a molded package structure cavity, and a thermo-electric structure to provide heat to, or remove heat from the electrical component.

FIG. 2 shows another IC embodiment 100 including a semiconductor die 102 suspended in a molded package structure cavity 110. In this example, a thermo-electric structure 200 is used to provide heat to, or remove heat from the electrical component 104. In one implementation, the thermo-electric structure 200 is a Peltier material structure, such as n-doped nanoparticles of Bismuth Telluride printed on a thermally and electrically insulating thick oxide material 204 on the upper surface of a silicon substrate 101. The dielectric layer 204 can be one or more inter-layer dielectric layers of a metallization structure that includes one or more conductive features. The thermo-electric structure 200 in this example is formed as a ring structure with an inner gap exposing an upper port of the dielectric material layer 204 to the ambient of the cavity 110. The thermo-electric structure 200 extends laterally outward from the inner gap to lateral edges of the die 102. The die 102 in this example includes a thermally and electrically conductive inner annular ring structure 202 formed through the dielectric layer 204 between an annular inner portion of the top side of the substrate 101 and an annular inner portion of the thermo-electric material layer 200. The inner annular ring structure 202 provides an inner annular thermal conduction path between the substrate 101 and the thermo-electric material layer 200.

A thermally and electrically conductive outer annular ring structure 113 is formed as a metal ring structure on which there are multiple instances of bond wire connections. The structure 113 is laterally outwardly spaced from the inner annular ring structure 202 proximate the lateral edge of the semiconductor die 102. The outer annular ring structure including one or more bond pads 113 is located in thermal conduction with the thermo-electric material layer 200 and with the bond pads 113 and the bond wires 112. The outer annular ring structure 113 provides a lateral thermal conduction path between the inner annular ring structure 202 and includes bond pads to transfer heat between the die 102 and the bond wires 112. The driver 118 includes an output 206 connected to the outer annular ring structure 113. The driver 118 provides a current or voltage signal to the thermo-electric structure 200 to selectively provide heat to, or remove heat from, the electrical component 104. This creates circuitous thermal conduction paths 208 from the substrate 101 near the protected electrical component 104, through the inner annular ring structure(s) 202, laterally through the thermo-electric material layer 200, and then through the bond pads of the outer ring structure 113 and the bond wires 112 to the leadframe conductive structures 108. The driver 118 provides a temperature servo loop to drive the thermo-electric material structure 200 in either a heating mode or a cooling mode. The example of FIG. 2 allows for die regulation at a lower temperature and a wider allowable variation in ambient temperature.

Figure 3:
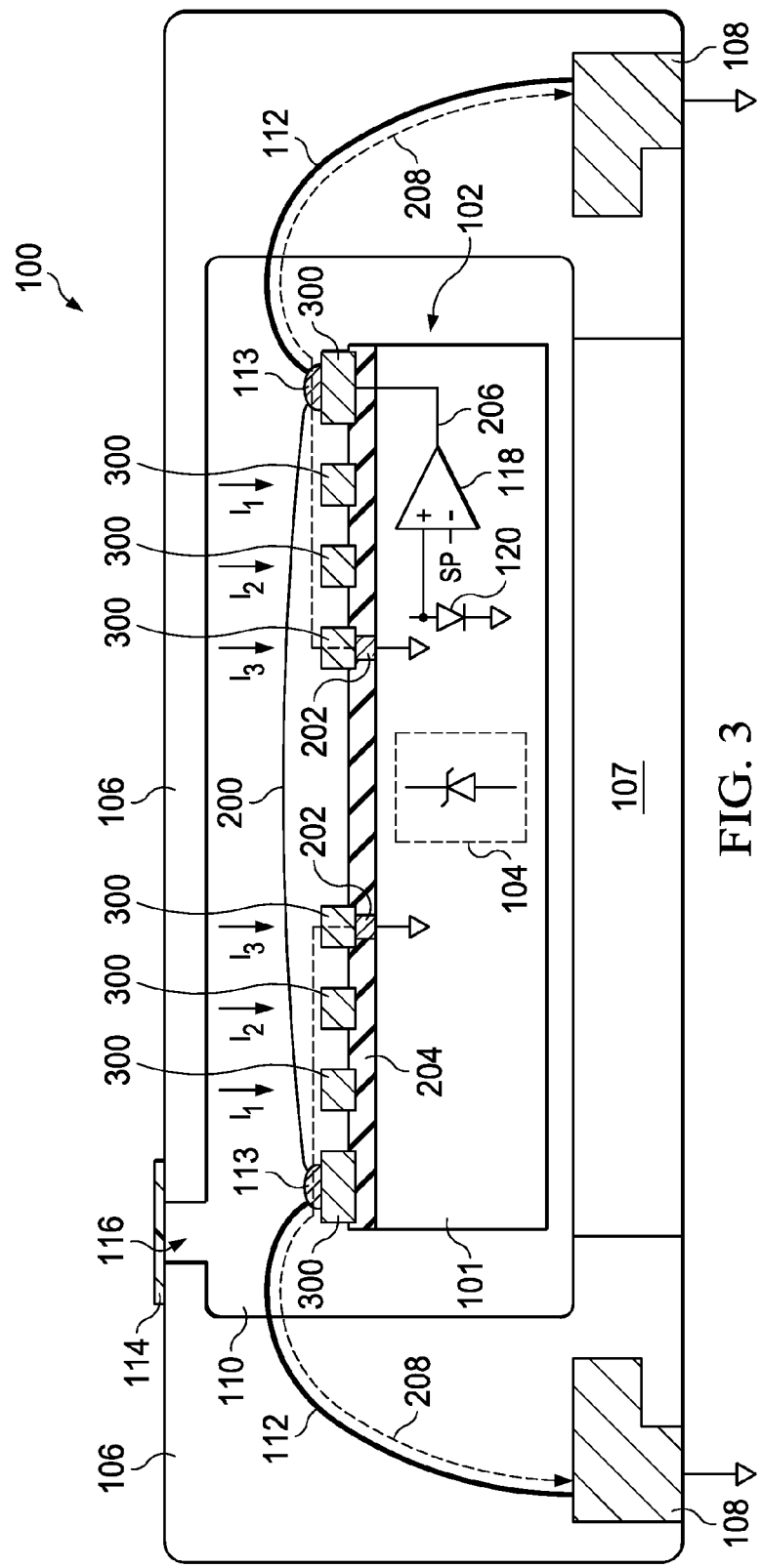
FIG. 3 is a sectional side elevation view of another integrated circuit embodiment including a semiconductor die suspended in a molded package structure cavity, and a multi-stage thermo-electric structure with conductive annular rings to control the electrical component temperature.

FIG. 3 shows another IC embodiment 100 including a semiconductor die 102 suspended in the molded package structure cavity 110. This example includes a multi-stage thermo-electric structure with a thermo-electric material layer 200 as well as thermally and electrically conductive annular ring structures 300 to control the electrical component temperature. The annular conductive ring structures 300 are laterally outwardly spaced from one another on the top side of the dielectric layer 204, and include an inner annular conductive structure 300 formed at least partially on the inner annular ring structure 202, and an outer annular conductive structure 300 formed proximate the lateral edge of the semiconductor die 102 in thermal conduction with the bond pads 113. The thermo-electric material structure 200 includes thermo-electric material 200 formed over portions of the top side of the dielectric layer 204 between the annular conductive structures 300 to transfer heat in stages between the inner annular ring structure 202 and the bond pads 113. This structure provides thermal pumping laterally across the surface between the inner annular ring in thermal connection with the silicon substrate 101 and an outer annular ring in thermal conduction with the bond pads 113 and the bond wires 112. The bond wires 112 provide a thermal sink to the ambient temperature through both the molded material 106 and the metallic path to the package pads 108 and circuit board (not shown). One or more pumping stages of thermo-electric material 200 are printed between the rings 300, and the material 200 can overlay the rings 300 as shown, although not a strict requirement of all embodiments. The rings 300 conduct currents $I_3$, $I_2$ and $I_1$ as shown in FIG. 3, and the circuitous thermal path 208 is as described above in connection with FIG. 2 to provide a thermal control zone including the electrical component 104.

Figure 4:
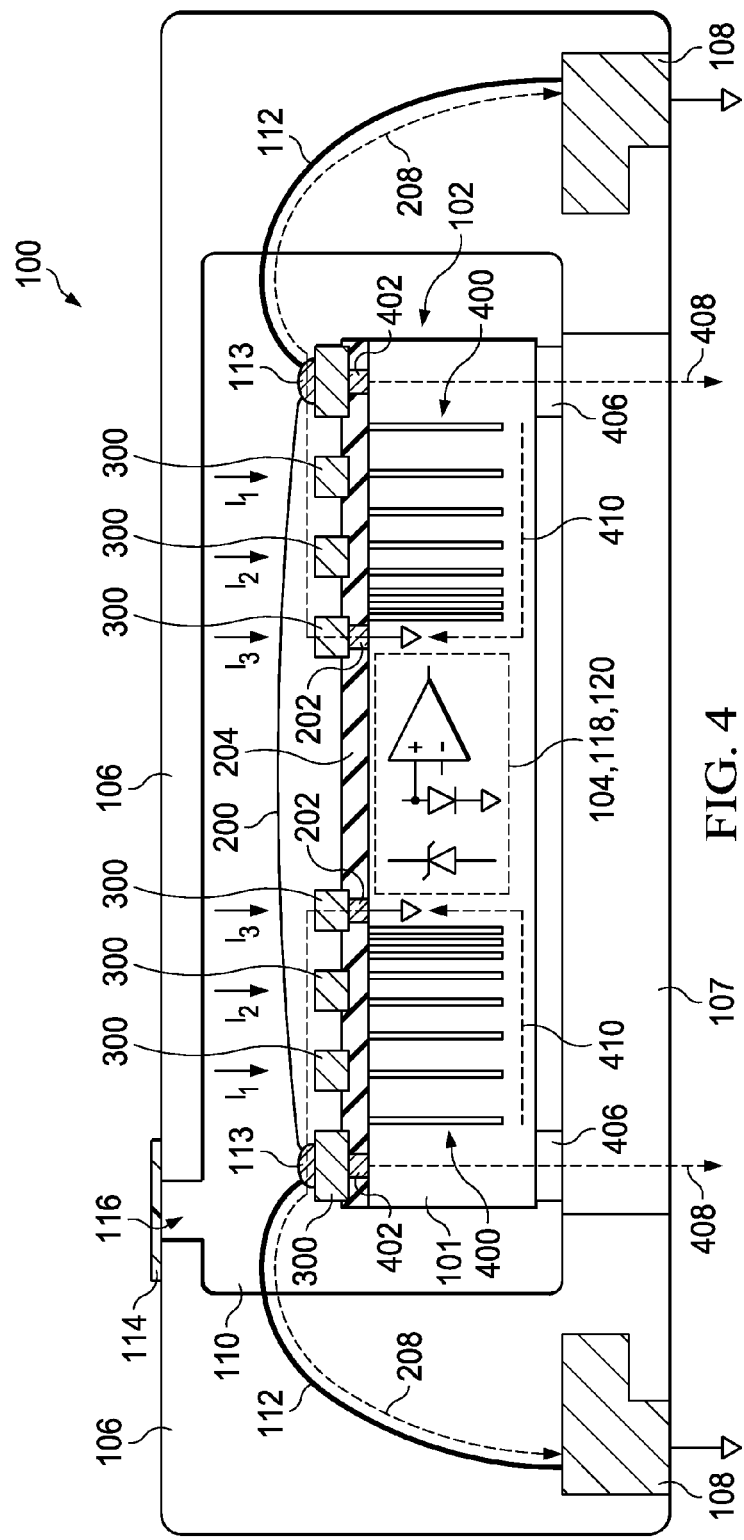
FIG. 4 is a sectional side elevation view of another integrated circuit embodiment including a semiconductor die suspended in a molded package structure cavity, and a thermo-electric structure with vertical trenches filled with insulating material in the semiconductor die.

FIG. 4 shows another IC embodiment 100 where the thermal sink to ambient is through a die attach path as well as the bond wire paths. The IC 100 in FIG. 4 includes a semiconductor die 102 suspended in a molded package structure cavity 110 as described above, and a thermo-electric structure 200. Semiconductor die 102 is patterned with vertical trenches 400 in an annular pattern. In certain examples, the trenches are filled, at least partially, with a thermally insulating material. In certain examples, the trenches 400 can extend to the bottom of the semiconductor die 102. In other examples, such as shown in FIG. 4, the trenches do not extend all the way to the bottom of the die 102. Conductive structures 402 are formed through the dielectric layer 204 between the outer annular ring 300 and the lateral outward ends of the substrate 101. In addition, the material 200 provides an outward thermal conduction path 208 as described above in connection with FIG. 2. The semiconductor die 102 includes one or more die attach structures 406 extending between the leadframe base structure 107 and a portion of the bottom side of the substrate 101 proximate the lateral edge of the semiconductor die 102 to provide a vertical thermal conduction path 408 to transfer heat between the semiconductor die 102 and the leadframe base structure 107. Where the trenches 400 do not extend all the way to the bottom of the die 102, a thermal leakage path 410 can exist under the bottoms of the trenches 400. The embodiment of FIG. 4 also includes vertical trenches 400 extending from a bottom side of the dielectric layer 204 partially or completely through 101. These trenches in certain examples are backfilled with a material with considerably less thermal conductivity than silicon 101. The vertical trenches are laterally outwardly spaced from one another between the lateral edge of the semiconductor die 102 and a middle portion of the substrate 101 that includes the electrical component 104. These trenches provide lateral thermal isolation in silicon 101 of region 104,118,120 from the outer annular portion of 101 in contact with 406.

Figure 5:
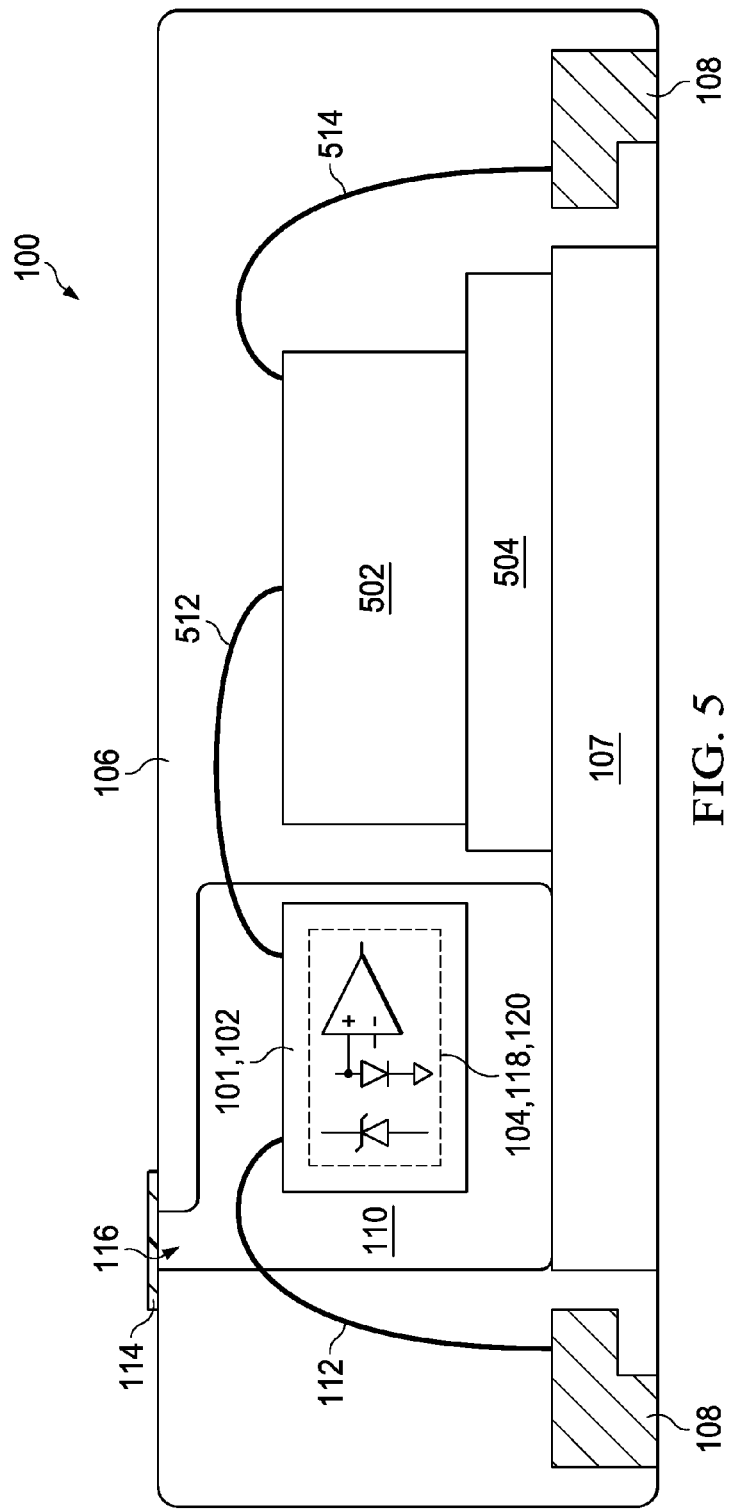
FIG. 5 is a sectional side elevation view of another integrated circuit embodiment including a semiconductor die suspended in a molded package structure cavity, and a second semiconductor die encapsulated in the molded package structure.

Referring now to FIG. 5, the circuitry can be segmented to separate low-power, precision, temperature managed components on one (e.g., smaller) die 102 as described above, along with a second die 502 encapsulated in the molded package structure 106. The second die 502 can be larger than the first die 102 in certain examples, and includes further circuits that may or may not handle a higher power load. The second die 502 can be mounted on the leadframe base structure 107 using a die attach structure 504 as shown. One or more additional bond wires 512 connects the second die 502 with one of the bond pads of the first die 102, and a bondwire 514 connects the second die 502 with an electrical conductor 108 of the leadframe structure.

Figure 6:
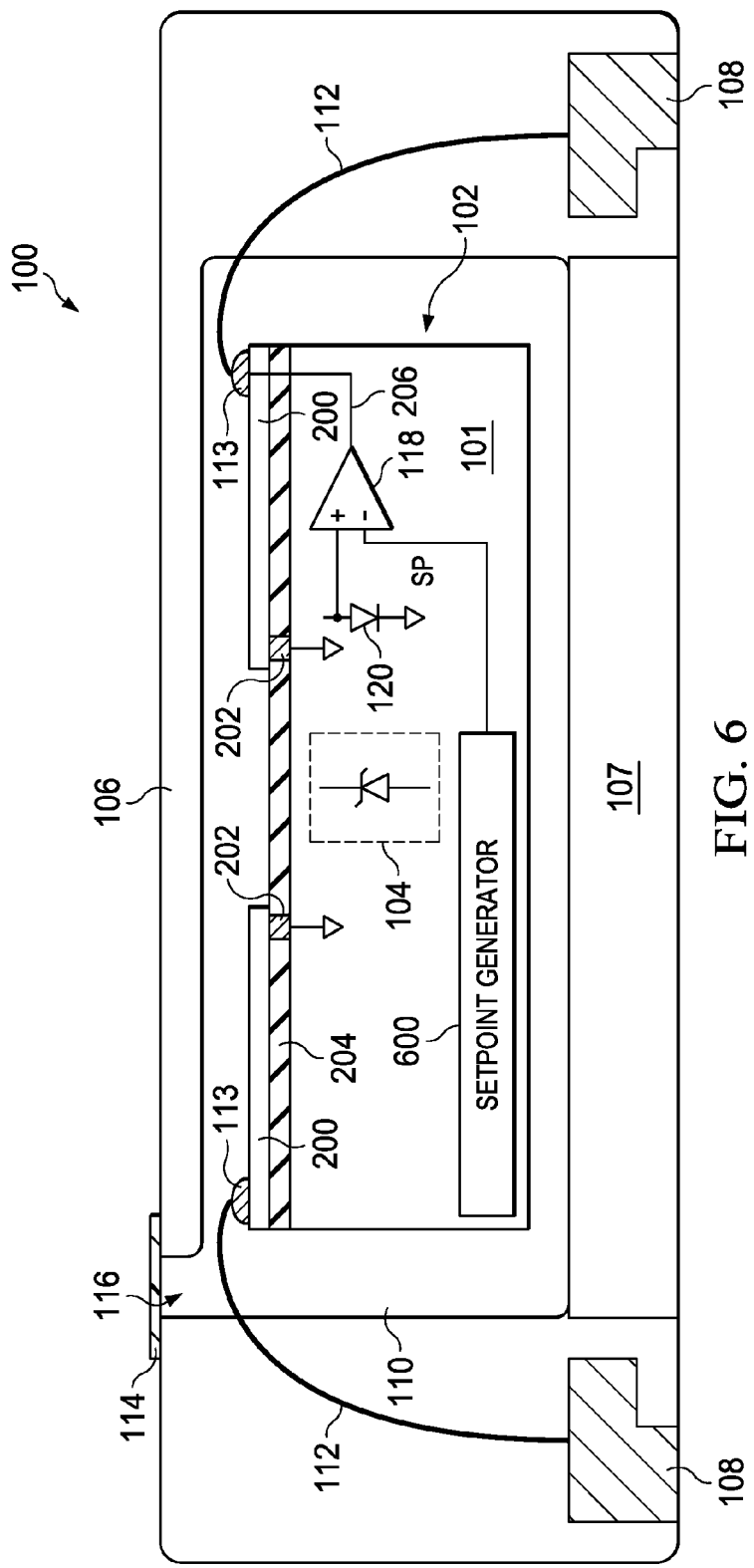
FIG. 6 is a sectional side elevation view of another integrated circuit embodiment including a semiconductor die suspended in a molded package structure cavity, and a thermal control circuit with a setpoint generator circuit.
Figure 7:
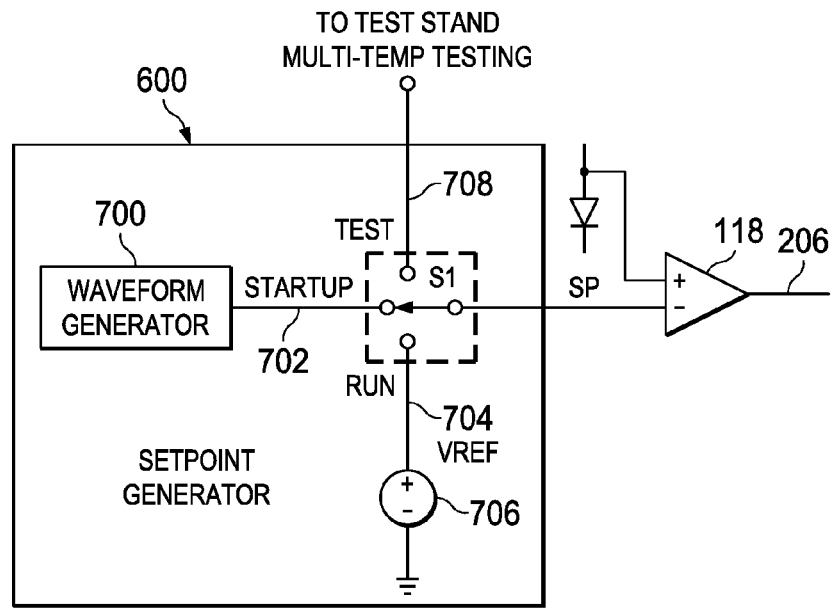
FIG. 7 is a schematic diagram showing an example setpoint generator with a waveform generator and a switch circuit in the integrated circuit of FIG. 6.
Figure 8:
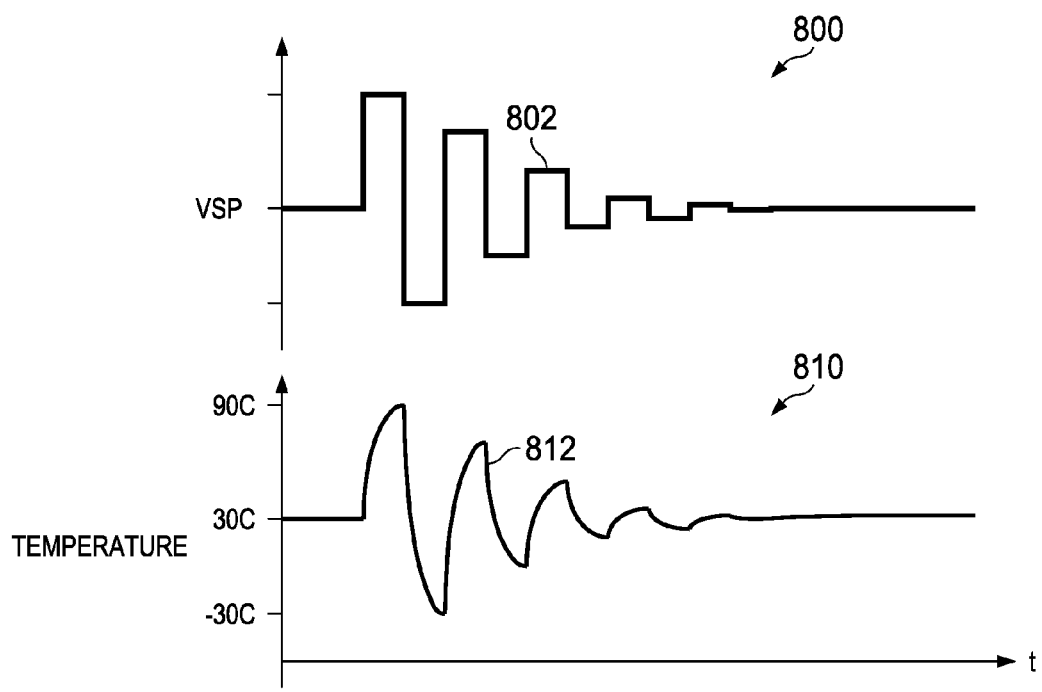
FIG. 8 is a signal diagram showing setpoint signal and temperature waveforms in the embodiment of FIGS. 6 and 7.

Referring now to FIGS. 6-8, FIG. 6 shows another IC embodiment 100, including a semiconductor die 102 suspended in a molded package structure cavity 110 as previously described. The die 102 in this example includes a thermal control circuit with a setpoint generator circuit 600. The thermal control can be open or closed-loop as discussed above. FIG. 7 shows an example setpoint generator 600 with a waveform generator circuit 700 and a switch circuit in the integrated circuit of FIG. 6. The waveform generator 700 includes an output 702 providing a signal to a single pole, triple throw switch circuit S1 that provides the setpoint signal SP to the error and driver amplifier 118 as described above. The switch S1 is shown in a center position labeled "Startup" to receive an output signal from the output 702 of the waveform generator circuit 700. One possible implementation, the waveform generator 700 is used during startup of the IC 102 as described further below in connection with FIG. 8. A second input 704 of the switch S1 is labeled "Run" and receives a fixed reference voltage signal VREF from a reference voltage source 706 during normal operation.

A third input 708 is connected to a corresponding conductor 108 of the IC 100 to receive a signal from a test stand or other external source (not shown) for testing at different controlled temperature settings during manufacturing. The thermal isolation of the die 102 provides the ability to implement advanced testing and calibration for the IC 100 during manufacturing. For example, voltage reference integrated circuit products 102 can be tested at several temperatures to compute the temperature coefficient, then electrically trimmed to reduce that temperature coefficient such that when the reference is then temperature controlled at a fixed temperature such that exceptionally high accuracy will be achieved. The "Test" switch setting allows an external reference source to force the electrical component temperature to various points. The thermal isolation of the die 102 in the cavity 110 facilitates rapid control of the temperature of the electrical component 104 to aid in fast testing at multiple temperatures. In addition, the testing is implemented on-board in certain examples using the waveform generator 700, without requiring expensive ovens or other external thermal control devices in order to thermally exercise the IC 100. In certain embodiments, the temperature regulation loop is modified during device testing and trimming to enable a low cost room temperature facsimile of multi-temperature production testing. This capability facilitates multi-temperature parametric acceptance testing, device characterization, temperature coefficient trim correction of the embedded components, outlier detection at temperature extremes, high temperature pre-conditioning, pre-aging and burn-in.

In various implementations, damped cyclical hysteretic temperature control algorithms may be employed at device startup to remove residual second order stress artifacts residing in the silicon design (silicon-metal). FIG. 8 provides a signal diagram 800 showing a setpoint signal voltage VSP as a curve 802 and a graph 810 showing a temperature waveform curve 812 in the embodiment of FIGS. 6 and 7. In one example, the waveform generator 700 provides the setpoint signal SP to the driver 118 as a multistep damped hysteretic waveform 802 during startup. The curve 812 shows a corresponding temperature of the electrical component 104 in the die 102 during application of the setpoint waveform 802. In this example, the waveform generator 700 applies alternating high and low levels in a decreasing envelope. IC dies are subject to stress issues associated with the silicon versus the surface metal interconnections. Such stresses can produce offsets in the operation of the electrical component 104.

The thermal and mechanical isolation of the electrical component 104 in the disclosed examples provides the ability to work out the residual hysteretic stress of silicon-metal interfaces by varying the set point signal SP at startup of the IC and/or during manufacturing to achieve improved accuracy for a signal or frequency reference type electrical component or circuit 104. For example, if the IC were trimmed in production at an exact operating temperature point, a subsequent thermal excursion could shift the reference value slightly. The waveform generator 700 can be used to reset the hysterstic memory of the silicon to a known point by performing controlled temperature excursions, such as the multistep damped hysteretic waveform 802 in FIG. 8. Prior to production trimming, the component 104 is thermally exercised per the profile of FIG. 8. The part is then production trimmed at the steady state point of FIG. 8. In the application, at startup, the part is thermally exercised to the same profile as FIG. 8 allowing any stress induced into the silicon prior to startup to be reset to the same conditions experienced at device trim thus producing the same accurate circuit response. The IC 100 can be trimmed during manufacturing to a specific temperature point (e.g., 30 degrees C.). On startup, the component 104 is thermally exercised above and below that point at startup. In one example, the startup waveform 802 begins and ends at the trimmed setting, and this level corresponds to the fixed reference signal VREF provided by the voltage source 706 during subsequent circuit operation. Still another use of a waveform is to determine the thermal resistance from the heated component to the environment. If evacuation of region 102 is complete, the thermal resistance will be higher. If evacuation is incomplete, thermal resistance will be lower. Thermal resistance can be indicated by the rise and fall time of the waveform on the temperature sensor 120 and can also be indicated by the amplitude of the signal on the temperature sensor 120. In this way, using a waveform can indicate incomplete processing or manufacturing defects. This information can be used to reject bad devices and to improve manufacturing process control.

Disclosed examples provide thermal isolation of one or more electrical components, with on-die thermal control circuitry. This advantageously avoids or mitigates problems and cost associated with conventional techniques of heating the die and package and part of the surrounding PC board. Among the advantages of the presently disclosed techniques and apparatus are improved thermal regulation of the silicon with low power overhead and rapid settling of temperature to a controlled value due to low thermal mass, as the thermal heating circuitry only needs to heat the floating die 102. In addition, the disclosed examples facilitate direct management and elimination of thermocouple induced errors, elimination of thermally induced hysteretic stress error sources. Moreover, the disclosed techniques provide reduction of thermal loss making printed Peltier or other thermo-electric elements feasible for thermal regulation to a lower temperature (e.g., 30C) while the ambient temperature varies over a very wide range. In addition, the disclosed designs provide direct management of thermal flow paths both on the silicon die 102 and through the package and leadframe structure. These benefits enable low cost, in-package multi-temperature test and trim of the device as seen in FIGS. 6-8 and facilitate low cost, on-board device burn-in and accelerated aging, as well as in-package temperature control algorithms to remove residual second order stress artifacts.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An integrated circuit (IC), comprising:
a leadframe structure, including a plurality of electrical conductors;
a plurality of bond wires individually connected to a corresponding one of the electrical conductors of the leadframe structure;
a molded package structure enclosing portions of the leadframe structure and the bond wires, the molded package structure including a cavity defined by an interior surface of the molded package structure; and
a semiconductor die disposed at least partially within the cavity, including:
an outer surface, at least a portion of the outer surface of the semiconductor die being spaced from the interior surface of the molded package structure,
a plurality of bond pads individually connected to a corresponding one of the bond wires,
at least one electrical component, and
a thermal control circuit to control a temperature of the electrical component.

2. The IC of claim 1, wherein all of the outer surface of the semiconductor die is spaced from the interior surface of the molded package structure, and wherein the semiconductor die is suspended within the cavity by the bond wires.

3. The IC of claim 1, wherein the cavity is sealed.

4. The IC of claim 1, wherein the thermal control circuit includes a resistor formed in the semiconductor die, and a driver to provide a current or voltage signal to the resistor to provide heat to the electrical component.

5. The IC of claim 4, wherein the thermal control circuit further includes a thermal sensing component to sense the temperature of the electrical component and to provide a first signal to the driver, and wherein the driver controls the current or voltage signal according to the first signal and a setpoint signal to regulate the temperature of the electrical component.

6. The IC of claim 1, wherein the thermal control circuit includes a thermo-electric structure, and a driver to provide a current or voltage signal to the thermo-electric structure to selectively provide heat to, or remove heat from, the electrical component.

7. The IC of claim 6, wherein the thermal control circuit further includes a thermal sensing component to sense the temperature of the electrical component and to provide a first signal to the driver, and wherein the driver controls the current or voltage signal according to the first signal and a setpoint signal to regulate the temperature of the electrical component.

8. The IC of claim 6, wherein the semiconductor die includes:
a substrate;
a dielectric layer formed on a top side of the substrate;
a thermo-electric material layer formed on a top surface of the dielectric layer to provide the thermo-electric structure;
an inner annular ring structure formed through the dielectric layer between an annular inner portion of the top side of the substrate and an annular inner portion of the thermo-electric material layer to provide an inner annular thermal conduction path between the substrate and the thermo-electric material layer; and
an outer annular ring structure laterally outwardly spaced from the inner annular ring structure and proximate a lateral edge of the semiconductor die, the outer annular ring in thermal conduction with the thermo-electric material layer and with the bond pads and the bond wires to provide a lateral thermal conduction path between the inner annular ring structure and the bond pads to transfer heat between the semiconductor die and the bond wires.

9. The IC of claim 8, wherein the semiconductor die further includes a die attach structure (406) extending between the leadframe structure and a portion of a bottom side of the substrate proximate the lateral edge of the semiconductor die to provide a further thermal conduction path to transfer heat between the semiconductor die and the leadframe structure.

10. The IC of claim 9,
wherein the semiconductor die further includes a plurality of annular conductive structures laterally outwardly spaced from one another on a top side of the dielectric layer, including an inner annular conductive structure formed at least partially on the inner annular ring structure, and an outer annular conductive structure formed proximate the lateral edge of the semiconductor die in thermal conduction with the bond pads; and
wherein the thermo-electric material structure includes thermo-electric material formed over portions of the top side of the dielectric layer between the annular conductive structures to transfer heat in stages between the inner annular ring structure and the bond pads.

11. The IC of claim 10, wherein the substrate includes:
a plurality of vertical trenches extending from a bottom side of the dielectric layer into the substrate, the vertical trenches laterally outwardly spaced from one another between the lateral edge of the semiconductor die and a middle portion of the substrate that includes the electrical component; and
an insulating material formed in the trenches.

12. The IC of claim 8,
wherein the semiconductor die further includes a plurality of annular conductive structures laterally outwardly spaced from one another on a top side of the dielectric layer, including an inner annular conductive structure formed at least partially on the inner annular ring structure, and an outer annular conductive structure formed proximate the lateral edge of the semiconductor die in thermal conduction with the bond pads; and
wherein the thermo-electric material structure includes thermo-electric material formed over portions of the top side of the dielectric layer between the annular conductive structures to transfer heat in stages between the inner annular ring structure and the bond pads.

13. The IC of claim 12, wherein the substrate includes:
a plurality of vertical trenches extending from a bottom side of the dielectric layer into the substrate, the vertical trenches laterally outwardly spaced from one another between the lateral edge of the semiconductor die and a middle portion of the substrate that includes the electrical component; and
an insulating material formed in the trenches.

14. The IC of claim 6, wherein the semiconductor die further includes a die attach structure extending between the leadframe structure and a portion of a bottom side of the substrate proximate the lateral edge of the semiconductor die to provide a further thermal conduction path to transfer heat between the semiconductor die and the leadframe structure.

15. The IC of claim 1, further comprising:
a second semiconductor die encapsulated in the molded package structure; and
a further bond wire connected between the second semiconductor die and one of the bond pads or one of the electrical conductors of the leadframe structure.

16. The IC of claim 1, wherein the thermal control circuit further includes:
   a thermal control component to control the temperature of the electrical component according to a current or voltage signal;
   a driver to provide the current or voltage signal to the thermal control component at least partially according to a setpoint signal.

17. The IC of claim 16, wherein the thermal control circuit further includes a waveform generator to provide the setpoint signal to the driver as a time-varying waveform.

18. The IC of claim 16, wherein the thermal control circuit further includes a thermal sensing component to sense the temperature of the electrical component and to provide a first signal to the driver, and wherein the driver controls the current or voltage signal according to the first signal and the setpoint signal to regulate the temperature of the electrical component.

19. An integrated circuit (IC), comprising:
   a molded package including a cavity; and
   a semiconductor die at least partially spaced from an interior surface of the molded package within the cavity, the semiconductor die including:
   at least one electrical component,
   a thermal control component to control the temperature of the electrical component according to a current or voltage signal, and
   a driver to provide the current or voltage signal to the thermal control component at least partially according to a setpoint signal.

20. An integrated circuit (IC), comprising:
a molded package including a cavity; and
a semiconductor die at least partially spaced from an interior surface of the molded package within the cavity, the semiconductor die including:
   at least one electrical component,
   a thermal sensing component to sense a temperature of the electrical component and to provide a first signal; and
   a temperature compensation circuit to control the temperature of the electrical component according to the first signal and a setpoint signal.

* * * * *